Jan. 4, 1966 R. L. MADSEN ETAL 3,227,965

SQUARE WAVE OSCILLATOR WITH LOW OUTPUT IMPEDANCE IN ALL STATES

Filed Jan. 17, 1963 2 Sheets-Sheet 1

INVENTORS
RAYMOND L. MADSEN
BY JOMAR SONGLI

Samuel B. Stone
ATTORNEY

INVENTORS
RAYMOND L. MADSEN
JOMAR SONGLI
BY Samuel B. Stone
ATTORNEY

United States Patent Office 3,227,965

Patented Jan. 4, 1966

3,227,965

SQUARE WAVE OSCILLATOR WITH LOW OUTPUT IMPEDANCE IN ALL STATES

Raymond Louis Madsen, Brea, and Jomar Songli, Downey, Calif., assignors to Beckman Instruments, Inc., a corporation of California Filed Jan. 17, 1963, Ser. No. 252,225
2 Claims. (Cl. 331—113)

Figure 1:
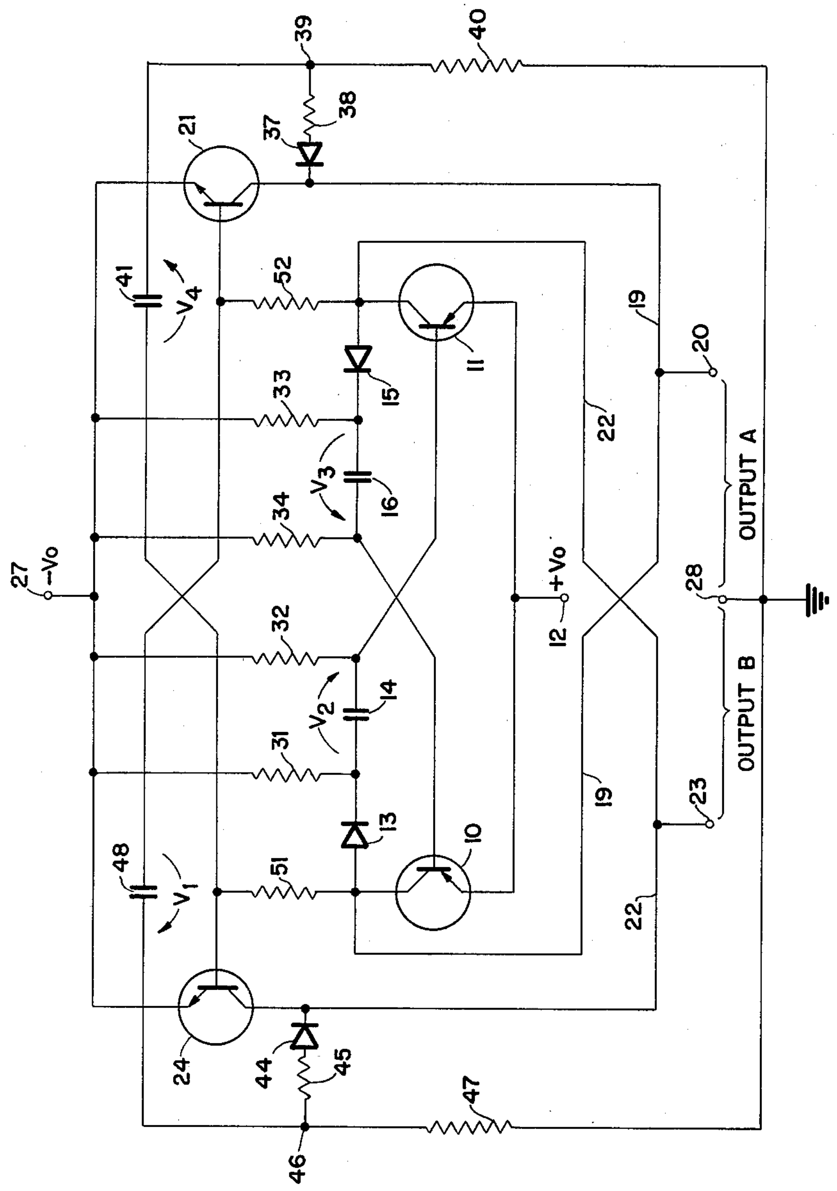

This invention relates to oscillators and more particularly to a multivibrator oscillator for producing a square wave output and which has a low output impedance in all states.

A conventional multivibrator generally includes a pair of tubes or a pair of semiconductive devices, with the latter being preferred in many applications today. A typical semiconductive multivibrator includes a pair of cross-coupled transistors and a plurality of passive components. The transistors alternately change states of conduction either in response to the operation of each other, or in response to an externally applied signal. An oscillator or clock source typically is a free-running multivibrator in which the transistors alternately change states at a frequency determined by the circuit constants of the multivibrator.

The multivibrator transistors generally switch from a high impedance state, or off, to a low impedance (saturated), or on, state. Frequently it is necessary to drive a low impedance load from the multivibrator transistors during each of their states of operation. A low impedance load presents no problem when the multivibrator transistors are in their low impedance saturated condition since the supply or bias voltage essentially is connected directly through the saturated impedance of the transistor to the load. However, when the transistor is in its high impedance state and current is drawn from the circuit, the bias voltage is reduced thereby reducing the voltage applied to the load. Frequently it is necessary to drive symmetrical low impedance circuitry, and numerous other circuits which require a low impedance source from both the on and off states of the multivibrator. With such low impedance loads, it frequently is necessary to provide a low impedance output for each state of operation for both transistors.

Previous attempts have been made to provide a relatively low output impedance in all states of operation of the multivibrator by connecting each multivibrator transistor through one or more emitter-followers. This arrangement provides a relatively low output impedance when the multivibrator transistors are in the high impedance state. However, the impedance of an emitter-follower is still substantially higher than the saturation impedance of the transistor.

Accordingly, it is a feature of the present invention to provide a transistorized multivibrator having a lower output impedance in all states than in presently known multivibrators.

It is a further feature of the present invention to provide a multivibrator having a low output impedance in all states without the necessity of employing emitter-followers.

An additional feature of the present invention is the provision of a transistorized multivibrator having a low output impedance in all states substantially equal to the saturation impedance of the transistors employed.

In accordance with a specific exemplary embodiment of a multivibrator constructed in accordance with the teachings of the present invention, a first pair of transistors are interconnected in a substantially conventional multivibrator configuration and an additional pair of transistors are interconnected with the first pair. All of the transistors operate either in the high impedance state or in the saturated state. The multivibrator provides two outputs, each having two voltage levels. A low impedance path through a saturated transistor is always provided to a voltage source. Thus, the voltages connected to the outputs are applied through the low saturation impedance of a transistor for all states of operation of the multivibrator.

Other features and objects of the invention will be better understood from a consideration of the following detailed description when read in conjunction with the attached drawings in which:

FIG. 1 is a circuit diagram of an exemplary multivibrator constructed in accordance with the teachings of the present invention; and FIGS. 2*a* through 2*f* are curves which illustrate the operation of the multivibrator shown in FIG. 1.

Referring now to FIG. 1, a pair of PNP transistors 10 and 11 are shown connected in a free-running multivibrator configuration. The emitters of the transistors 10 and 11 are connected to a positive voltage ($+V_0$) terminal 12. The collector of the transistor 10 is connected through a diode 13 and a capacitor 14 to the base of the transistor 11, and the collector of the transistor 11 is connected through a diode 15 and a capacitor 16 to the base of the transistor 10. The collector of the transistor 10 is connected through a line 19 to an output terminal 20, and through the line 19 to the collector of an NPN transistor 21. The collector of the transistor 11 is connected through a line 22 to an output terminal 23, and through the line 22 to the collector of an NPN transistor 24. The emitters of the transistors 21 and 24 are connected to a negative voltage terminal 27. The outputs from the multivibrators shown in FIG. 1 during its two states of operation are taken between the output terminal 20 and a ground terminal 28, and the output terminal 23 and the ground terminal 28. These outputs may be referred to as output A and output B, respectively.

The junction between the diode 13 and the capacitor 14 is connected through a resistance 31 to a negative voltage ($-V_0$) terminal 27, and the junction between the capacitor 14 and the base of the transistor 11 is connected through a resistance 32 to the negative voltage terminal 27. In a similar manner, the junction of the diode 15 and the capacitor 16 is connected through a resistance 33 to the terminal 27, and the junction between the capacitor 16 and the base of the transistor 10 is connected through a resistance 34 to the terminal 27.

The collector of the transistor 21 is connected through a diode 37 and a resistance 38 to a junction point 39. The junction point 39 is connected through a resistance 40 to the ground terminal 28, and through a capacitance 41 to the base of the transistor 24. The collector of the transistor 24 is connected through a diode 44 and a resistance 45 to a junction point 46. The junction point 46 is connected through a resistance 47 to the ground terminal 28, and through a capacitance 48 to the base of the transistor 21. The collector of the transistor 10 is connected through a resistance 51 to the base of the transistor 24, and the collector of the transistor 11 is connected through a resistance 52 to the base of the transistor 21.

The capacitance 14 and resistance 32, and the capacitance 16 and the resistance 34 are the duty cycle and frequency determining components in the multivibrator in FIG. 1. According to a feature of this invention, it is the function of the transistors 21 and 24 to provide a low impedance (the saturation impedance) output when the respective transistors 10 and 11 are in a high impedance state. Thus, the outputs A and B are always low impedance outputs regardless of the voltages applied to the terminals 20 and 23 by means of the transistors 10, 11, 21 and 24.

Considering now the operation of the multivibrator shown in FIG. 1, when the transistor 10 is in the low impedance or saturated state, the transistor 24 is driven into its low impedance or saturated state. At the same time, the transistor 11 is in a high impedance state, or off condition, allowing its collector to be clamped to $-V_0$ at the terminal 27 through the saturated transistor 24. Similarly, the transistor 21 is off and its collector is connected to the $+V_0$ terminal 12 through the saturated transistor 10. When the transistor 11 turns on and becomes saturated, the transistor 21 is driven to saturation while the transistors 10 and 24 are turned off. Thus, the collector of the transistor 24 is now clamped to the $+V_0$ terminal 12 through the saturated transistor 11, and the collector of the transistor 10 is connected to the $-V_0$ terminal 27 through the saturated transistor 21. The outputs A and B therefore are connected either to the $+V_0$ terminal 12 or the $-V_0$ terminal 27 through the low saturation impedance of a transistor for both of the states of operation of the multivibrator. This operation provides a low output impedance at all times.

Figure 2:
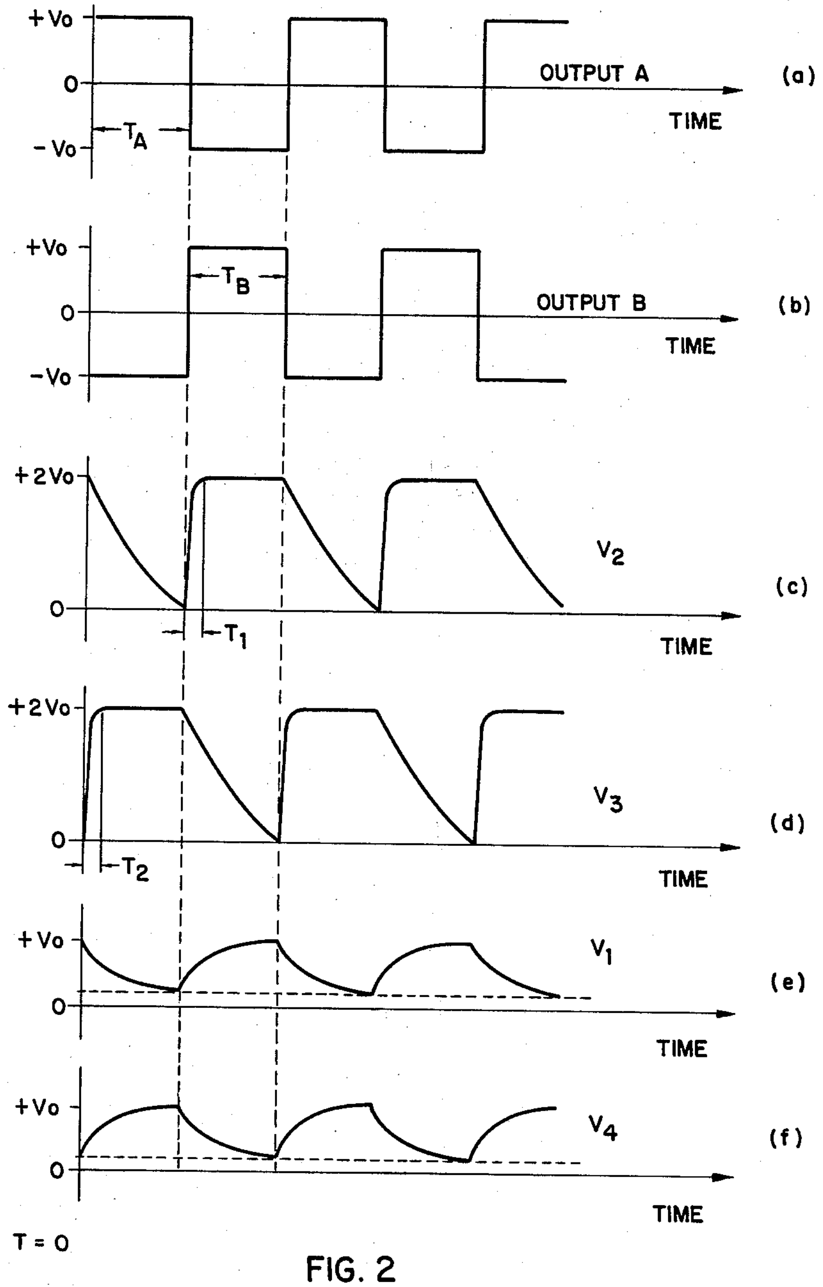

The circuit shown in FIG. 1 may now be considered in greater detail in conjunction with the curves shown in FIGS. 2*a* through 2*f*. Assuming that the multivibrator shown in FIG. 1 has been running for a sufficient length of time for steady operation to be established, FIG. 2 shows the waveforms observed for several cycles of operation. FIGS. 2*a* and 2*b* respectively show the square wave voltage outputs A and B. FIGS. 2*c* and 2*d* illustrate the respective voltages V2 and V3 across the capacitors 14 and 16, respectively. FIGS. 2*e* and 2*f* illustrate the respective voltages V1 and V4 across the respective capacitors 48 and 41.

The curves of FIG. 2 start at time $t=0$ with the initial conditions of the transistors 10 and 24 having just turned on and the transistors 11 and 21 having been turned off. The output A, between the terminals 20 and 28, is at $+V_0$, and the output B, between the terminals 23 and 28, is at $-V_0$. The path from the terminal 20 to the $+V_0$ terminal 12 exists through the saturated transistor 10, and the path from the terminal 23 to the $-V_0$ terminal 27 exists through the saturated transistor 24. At this time, the diode 13 is forward biased causing the transistor 11 to be back-biased by the voltage V2 across the capacitor 14, the voltage V2 being approximately $+2V_0$. As shown in FIG. 2*c*, the capacitor 14 discharges through the resistance 32 toward zero volts, and if allowed to continue would then charge toward $-2V_0$ volts. However, as the voltage V2 across the capacitor 14 nears zero, the transistor 11 begins to conduct and initiates the switching action at time $T_A$ shown in FIG. 2*a*. This action results in the ouput A (FIG. 2*a*) going to $-V_0$, and the output B (FIG. 2*b*) going to $+V_0$.

Returning to the start of the observation, the voltage V3 across the capacitor 16 is approximately zero volts as shown in FIG. 2*d*. Since the transistors 10 and 24 have just turned on, the junction of the capacitor 16 and the resistance 34 is clamped to the $+V_0$ terminal 12 through the transistor 10. To prevent the capacitor 16 from loading the transistor 24, the diode 15 becomes reversed biased. The capacitor 16 then charges through the resistance 33 to a voltage V3 which is approximately $+2V_0$ in the time T2 shown in FIG. 2*d*. At the time $T_A$, shown in FIG. 2*a*, the capacitor 16 duplicates the action at the start of the observation described above for the capacitor 14. Similarly, at $T_A$, the capacitor 14 duplicates the action at the start of the observation described above for the capacitor 16, with diode 13 performing the same task for transistor 21 as previously performed by the diode 15 for transistor 24 and the capacitor 14 charging to approximately $2V_0$ in the time T1 as shown in FIG. 2*c*. To this point, the above description concerning the transistors 10 and 11 is substantially that of the typical well-known free-running multivibrator.

As previously noted, the present multivibrator operates to provide a low output impedance in all states of operation. The low output impedance is achieved by employing the transistors 21 and 24 and their associated circuitry, and by operating each of the transistors 10, 11, 21 and 24 in the saturated state and in the high impedance state. The transistors 21 and 24 are to be distinguished from usual emitter-followers which do not provide an output impedance as low as the saturated impedance of the transistor. Again referring back to the start of the observation shown in FIG. 2, the transistors 10 and 24 have just turned on. The transistor 24 was turned on by the transistor 10 through the resistance 51. When the transistor 10 turns on and conducts, it pulls the transistor 21 out of saturation to produce enough loop gain to turn off the transistor 11. When the transistor 11 turns off, it removes the base drive from the transistor 21, thereby turning off the transistor 21. The transistor 21 is maintained off by the discharge of the capacitor 48 through the combination of the resistance 52, the resistance 45 and the forward biased diode 44. This operation is illustrated in FIG. 2*e* by the voltage curve V1 as a function of time. The time constant formed by the capacitor 48, the resistance 52 and the resistance 45 is sufficiently long to prevent the transistor 21 from coming back on until the transistor 11 drives the transistor 21 on at the proper time. When the transistor 21 does turn on, the diode 44 becomes back-biased to prevent the capacitor 48 from loading the collector of the transistor 11. The capacitor 48 then charges through the resistance 47 to its initial value of $+V_0$. The resistance 45 is used to limit the reverse bias on the transistor 21 to a proper operating value. Since the circuit is symmetrical, the explanation presented above should suffice for an understanding of the operation of the remaining half of the circuit.

The essential function of the circuit shown in FIG. 1 requires the current capabilities of the transistors 10 and 11 in saturation to be sufficiently greater than that of the transistors 21 and 24. This requirement is necessary to enable the transistor 10 to pull the transistor 21 out of saturation, or the transistor 11 to pull the transistor 24 out of saturation to initiate the multivibrator switching action. For a given set of transistors, the resistances 51 and 52 must be selected in establishing the above condition.

The low impedance path provided by the transistors 21 and 24 additionally offer improvement in operation with respect to variations in temperature. When either of the transistors 10 or 11 is off, transistor 21 or 24, respectively, provides a low impedance path for leakage current which is a function of temperature. Thus, the effect of the collector leakage current from transistors 10 or 11 respectively on the voltages to which the capacitors 14 and 16 are charged and discharged is reduced.

The multivibrator described and discussed is capable of driving any circuit requiring a low impedance source of current from both the on and off state of a given output of the multivibrator. The configuration described reduces the number of components and transistors needed to accomplish the low impedance feature compared to conventional arrangements. In addition, fast rise and fall times are achieved. By the use of conventional flip-flop techniques, the free-running multivibrator shown may be made to operate as a monostable or a bistable multivibrator.

The following are specific examples of components which have been found suitable for a circuit constructed like that shown in FIG. 1:

| | |
|---|---|
| Transistors **10** and **11** | 2N1026. |
| Transistors **21** and **24** | 2N1987. |
| Diodes **13**, **15**, **37** and **44** | 1N461. |
| Capacitors **14** and **16** | 2 MF, metalized Mylar, 5%. |
| Capacitors **41** and **48** | 1 MF, metalized Mylar, 5%. |
| Resistances **31** and **33** | 12K. |
| Resistances **32** and **34** | 75K. |
| Resistances **40** and **47** | 120K. |
| Resistances **38** and **45** | 160K. |
| Resistances **51** and **52** | 200K. |
| $+V_0$ | +12 V. |
| $-V_0$ | —12 V. |

It now should be apparent that the present invention provides a multivibrator circuit employing a minimum of active and passive components, and which provides a low output impedance in all states of operation. Although particular components and voltages have been discussed in connection with the specific embodiment of the circuit constructed in accordance with the teachings of the present invention, others may be utilized. Furthermore, it will be understood that although an exemplary embodiment of the present invention has been disclosed and discussed, other applications and circuit arrangements are possible and that the embodiment disclosed may be subjected to various changes, modifications and substitutions without necessarily departing from the spirit of the invention.

What is claimed is:

1. A circuit arrangement for producing output pulses including a first pair of transistors, each being operated in a high impedance state or a saturated state and each having an emitter, a collector and a base, first means including a capacitor and a diode coupling the base of a first and said transistors to the collector of a second of said transistors, second means including a capacitor and a diode connecting the base of the second transistor to the collector of the first transistor, third means connecting the emitters of said transistors to a first voltage terminal, fourth means coupling the collector of the first transistor to a first output terminal, fifth means connecting the collector of the second transistor to a second output terminal, sixth means coupling the bases of said transistors to a second voltage terminal, the improvement comprising a second pair of transistors of the opposite conductivity type as said first pair of transistors, each being operated in a high impedance state or a saturated state, and each having an emitter, a collector and a base, first impedance means connecting the collector of the first transistor of said first pair of transistors to the base of a first transistor of said second pair of transistors, second impedance means coupling the collector of the second transistor of said first pair of transistors to the base of a second transistor of said second pair of transistors, seventh means coupling the emitters of said second pair of transistors to said second voltage terminal, eighth means including a capacitor and a diode connecting the base of the first transistor of said second pair of transistors with the collector of the second transistor of said second air of transistors, ninth means including a capacitor and a diode connecting the base of the second transistor of said second pair of transistors with the collector of said first transistor of said second pair of transistors, tenth means coupling the collector of the first transistor of said second pair of transistors to said second output terminal, eleventh means coupling the collector of the second transistor of said second pair of transistors to said first output terminal, a common terminal separate from said first and second voltage terminals, and with respect to which voltages at said first and second output terminals may be measured, and means coupling said common terminal with said eighth means and with said ninth means.

2. A device for producing output pulses including first and second transistors, each being operated in a high impedance state or a saturated state and each having a first, a second and a third electrode, first means including a capacitor and a diode connected in series coupling the first electrode of the first transistor to the second electrode of the second transistor, second means including a capacitor and a diode connected in series connecting the first electrode of the second transistor to the second electrode of the first transistor, a first voltage terminal, third means connecting the third electrodes of said transistors to said first voltage terminal, a first output terminal, fourth means coupling the second electrode of the first transistor to said first output terminal, a second output terminal, fifth means connecting the second electrode of the second transistor to said second output terminal, a second voltage terminal, sixth means coupling the first electrodes of said transistors to said second voltage terminal, the improvement comprising third and fourth transistors being of opposite conductivity type as said first and second transistors, each of said third and fourth transistors being operated in a high impedance state or a saturated state and each having a first, a second and a third electrode, first impedance means connecting the second electrode of the first transistor to the first electrode of the third transistor, second impedance means coupling the second electrode of the second transistor to the first electrode of the fourth transistor, seventh means coupling the third electrodes of said third and fourth transistors to said second voltage terminal, eighth means including a capacitor, a resistance and a diode connected in series coupling the first electrode of the third transistor with the second electrode of the fourth transistor, ninth means including a capacitor, a resistance and a diode connected in series connecting the first electrode of the fourth transistor with the second electrode of the third transistor, tenth means coupling the second electrode of the third transistors to said second output terminal, eleventh means coupling the second electrode of the fourth transistor to said first output terminal a common terminal separate from said first and second voltage terminals, and with respect to which voltages at said first and second output terminals may be measured, twelfth means coupling said common terminal with said eighth means and with said ninth means, impedance means coupled between the junction of said capacitor and diode in said first means and said second voltage terminal, and impedance means coupled between the junction of said capacitor and diode in said second means and said second voltage terminal whereby said first and second transistors assume opposite states, said third transistor assumes the same state as said first transistor, and said fourth transistor assumes the same state as said second transistor.

(References on following page)

References Cited by the Examiner

UNITED STATES PATENTS

| | | | |
|---|---|---|---|
| 2,787,712 | 4/1957 | Priebe et al. | 331—113 |
| 2,892,035 | 6/1959 | Trousdale | 331—113 X |
| 2,948,820 | 8/1960 | Bothwell | 307—88.5 |

OTHER REFERENCES

Jovanovic, "Multivibrator Circuit Using PNP and NPN Junction Transistors." Electronic Engineering, May 1959, page 301.

ROY LAKE, *Primary Examiner.*

JOHN KOMINSKI, *Examiner.*

UNITED STATES PATENT OFFICE

CERTIFICATE OF CORRECTION

Patent No. 3,227,965 January 4, 1966

Raymond Louis Madsen et al.

It is hereby certified that error appears in the above numbered patent requiring correction and that the said Letters Patent should read as corrected below.

Column 5, line 44, for "and" read -- of --; same column 5, line 73, for "air" read -- pair --.

Signed and sealed this 27th day of December 1966.

(SEAL)
Attest:

ERNEST W. SWIDER
Attesting Officer

EDWARD J. BRENNER
Commissioner of Patents